(12) United States Patent
Quon et al.

(10) Patent No.: US 6,899,527 B2
(45) Date of Patent: May 31, 2005

(54) CLOSED-DRIFT HALL EFFECT PLASMA VACUUM PUMP FOR PROCESS REACTORS

(75) Inventors: Bill H Quon, Brea, CA (US); Samuel S. Antley, Cottonwood, AZ (US); Andrej S Mitrovic, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 10/739,948

(22) Filed: Dec. 19, 2003

(65) Prior Publication Data

US 2004/0151595 A1 Aug. 5, 2004

Related U.S. Application Data

(63) Continuation of application No. PCT/US02/15944, filed on May 21, 2002.
(60) Provisional application No. 60/298,877, filed on Jun. 19, 2001.

(51) Int. Cl.[7] .......................... F04B 37/02; F04B 23/00; C23C 16/00
(52) U.S. Cl. ............................. 417/49; 417/48; 417/53; 417/313; 118/715

(58) Field of Search .............................. 417/49, 48, 53, 417/313, 410.1, 572; 118/715, 723 R, 723

(56) References Cited

U.S. PATENT DOCUMENTS

| 3,151,259 A | * | 9/1964 | Per Gloersen et al. ......... 310/11 |
| 4,641,060 A | | 2/1987 | Dandl |
| 5,475,354 A | * | 12/1995 | Valentian et al. ............ 335/296 |
| 5,482,611 A | * | 1/1996 | Helmer et al. .......... 204/298.17 |
| 5,581,155 A | * | 12/1996 | Morozov et al. ........ 315/111.21 |
| 5,845,880 A | * | 12/1998 | Petrosov et al. ............. 244/169 |
| 5,975,855 A | | 11/1999 | Ensberg et al. |

FOREIGN PATENT DOCUMENTS

| JP | 08-162412 | 6/1996 |
| WO | WO 00/00741 | 1/2000 |

* cited by examiner

Primary Examiner—Cheryl Tyler
Assistant Examiner—Timothy P. Solak
(74) Attorney, Agent, or Firm—Pillsbury Winthrop LLP (57) ABSTRACT

A closed-drift Hall effect plasma vacuum pump includes one or more pumping conduits which are linked with a radial magnetic field. The magnetic field separates a plasma from a plasma at a higher pressure which is formed by cross-field plasma transport from a plasma processing region.

15 Claims, 9 Drawing Sheets

CLOSED-DRIFT HALL EFFECT PLASMA VACUUM PUMP FOR PROCESS REACTORS

This is a continuation of International Application No. PCT/US02/15944, filed on May 21, 2002, and, in turn, claims benefit of U.S. Provisional Application No. 60/298,877, filed Jun. 19, 2001, the contents of both of which are incorporated herein by reference.

BACKGROUND OF THE INVENTION

1. Field of Invention

The present invention relates to process reactors, and in particular relates to reactors employing process gases and a plasma source.

2. Description of Background Information

Typically, plasma is a collection of charged particles containing approximately equal numbers of positive and negative charge carriers and can be used in certain processing systems which are useful for a wide variety of applications. For example, plasma processing systems are of considerable use in the manufacture and processing of semiconductors, integrated circuits, displays and other electronic devices, both for etching and layer deposition on substrates, such as, for example, semiconductor wafers.

Generally, the basic components of such a system include a plasma chamber enclosing a processing region in which plasma is formed and a pumping region connecting to a vacuum port. Other basic components of such a system generally include a wafer supporting chuck, which is connected to an RF power supply in order to accelerate the plasma ions to strike the wafer surface with a desired energy. This RF power may often produce the process plasma; however, an additional electrode or RF antenna can be used to produce the process plasma. The chuck is normally cylindrical and flat, supporting a 200 to 300 mm, or larger, diameter wafer or other substrate for processing. For efficient use of chamber space, i.e. maximizing gas flow uniformity and minimizing the reactor footprint, process gases are injected above or around the plasma region, and the used gases are removed through an annular passage between the chuck and the sidewall to the vacuum pumping port provided in the lower portion of the vacuum chamber. With a large mass flow rate of processing gases, a large pumping speed for removing the used gases is important to process performance, including factors such as the etch rate, high aspect ratio etch, profile figure, damage and contamination. The gas conductance of the annular region often severely restricts the pumping speed delivered to the processing region.

In addition to the need of larger chamber conductance, the need for higher pumping speed at the process operating pressure range, i.e., 10–100 m Torr, is generally required for high density plasma (HDP) etch systems. Plasma vacuum pump systems have been proposed for the process system to provide the required pumping speed for removal of the effluent gases.

Some plasma duct systems have employed, for example, magnethydrodynamic (MHD) plasma pumps, to move plasma ions and electrons in an E×B drift direction, where an external electric field and magnetic field are perpendicular to each other, and are perpendicular to the direction of plasma flow. In MHD pumps, the magnetic field must be strong enough so the ions are magnetized.

SUMMARY OF THE INVENTION

The present invention provides a plasma processing pump that is configured to pump particles from a first region containing a plasma to a second region containing a plasma at a higher pressure. The plasma pump comprises a toroidal conduit having an inlet end and an outlet end. A longitudinal axis and a periphery extend between the inlet end and the outlet end, and inner and outer peripheries extending between the inlet end and the outlet end. An inner array of magnets is arrayed about the inner periphery of the conduit proximate the inlet end and an outer array of magnets is arrayed about the outer periphery of the conduit proximate the inlet end. The inner and outer magnet arrays cooperate to provide a magnetic field having field lines which extend generally transverse to the longitudinal axis of the conduit. A cathode is located within the conduit further from the inlet end than the magnet array. The cathode is biasable to an electric potential different from an electric potential present in the conduit proximate the inlet end.

Another aspect of the invention is to provide a method of pumping particles from the first region containing a plasma to the second region through the toroidal conduit. The method comprises providing a magnetic field having field lines which extend generally transverse to the longitudinal axis of the conduit and providing an electric field in the conduit, having an electric potential different from an electric potential present in the conduit proximate the inlet end.

A further aspect of the invention is to provide a plasma processing system. The plasma processing system comprises a chamber containing a plasma processing region, a chuck constructed and arranged to support a substrate within the chamber in the processing region and a chamber outlet to enable particles within the plasma processing region to exit the chamber. The plasma processing system further comprises a toroidal conduit having an inlet end and an outlet end. A longitudinal axis and a periphery extend between the inlet end and the outlet end and inner and outer peripheries extending between the inlet end and the outlet end. An inner array of magnets is arrayed about the inner periphery of the conduit proximate the inlet end and an outer array of magnets is arrayed about the outer periphery of the conduit proximate the inlet end. The inner and outer magnet arrays cooperate to provide a magnetic field having field lines which extend generally transverse to the longitudinal axis of the conduit. A cathode is located within the conduit further from the inlet end than the magnet array. The cathode is biasable to an electric potential different from an electric potential present in the conduit proximate the inlet end.

DETAILED DESCRIPTION OF SEVERAL EMBODIMENTS OF THE INVENTION

Figure 1:
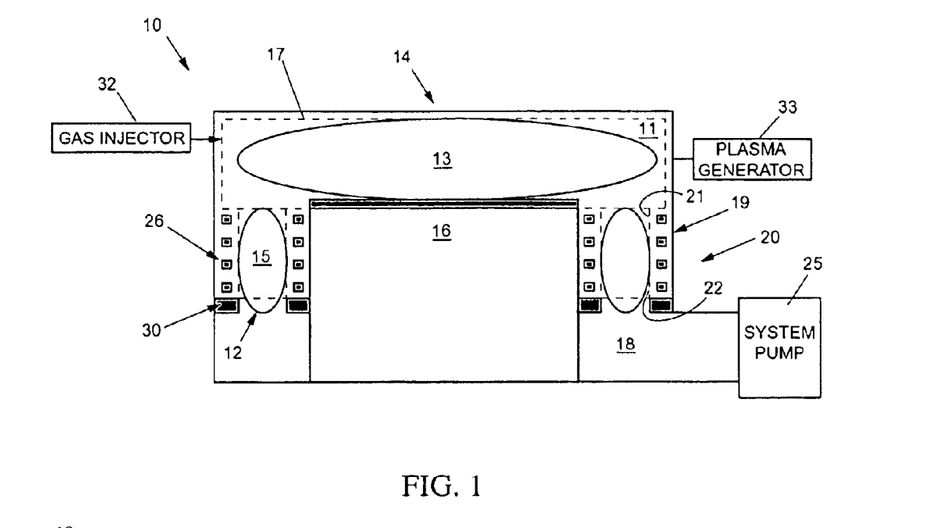
FIG. 1 is a schematic view showing a plasma processing system and device embodying the principles of the present invention.

FIG. 1 shows the structure of a plasma processing system and a plasma pump according to the present invention. The plasma processing system, generally indicated at 10, includes the plasma pump, generally indicated at 20.

The plasma pump 20 is configured to pump gases from a first region 11 containing a process plasma 13 through a second region 12 containing a pumping plasma 15, to a third region 18 adjacent the pumping port, which is typically at a pressure that is equal to or greater than process plasma 13. A magnet array, generally indicated at 26, including a plurality of magnet rings, is arranged in the plasma pump 20 and is configured to enable rapid transport of the processing plasma 13 in the processing region 11 to the pumping plasma 15 in the discharge region 12, and onwards to region 18 adjacent the pumping port.

The plasma processing system 10 comprises a vacuum chamber, generally indicated at 14, that defines the first region or the plasma processing region 11, and a chuck 16 constructed and arranged to support a substrate, such as, for example, a semiconductor wafer, within the chamber 14 in the processing region 11. A toroidal passage extending from the process region 11 to the chamber outlet region 18, which is referred to as plasma vacuum pump conduit 19, may be formed in communication with the chamber 14 to enable gases within the plasma processing region 11 to exit the chamber 14.

Generally, plasma generation gas 17, which may be any gas that is ionizable to produce a plasma, is introduced into the chamber 14 to be made into a plasma. The plasma generation gas 17 may be selected according to the desired application as understood by one skilled in the art and may be nitrogen, xenon, argon, carbon tetrafluoride ($CF_4$) or octafluorocyclobutane ($C_4F_8$) for fluorocarbon chemistries, chlorine ($Cl_2$), hydrogen bromide (HBr), or oxygen ($O_2$), for example.

A plasma generator 33 is coupled to the chamber 14 to generate plasma 13 within the plasma processing region 11 by ionizing the plasma processing gases 17, for example, by supplying RF or DC power thereto.

Figure 2A:
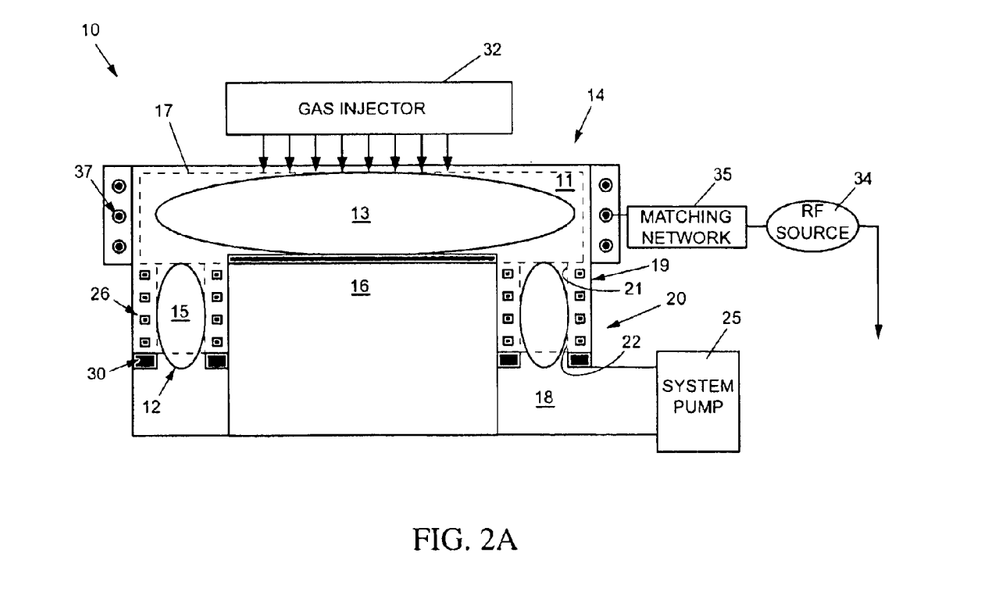
FIG. 2A is a schematic view showing an alternative plasma processing system and device embodying the present invention.
Figure 2B:
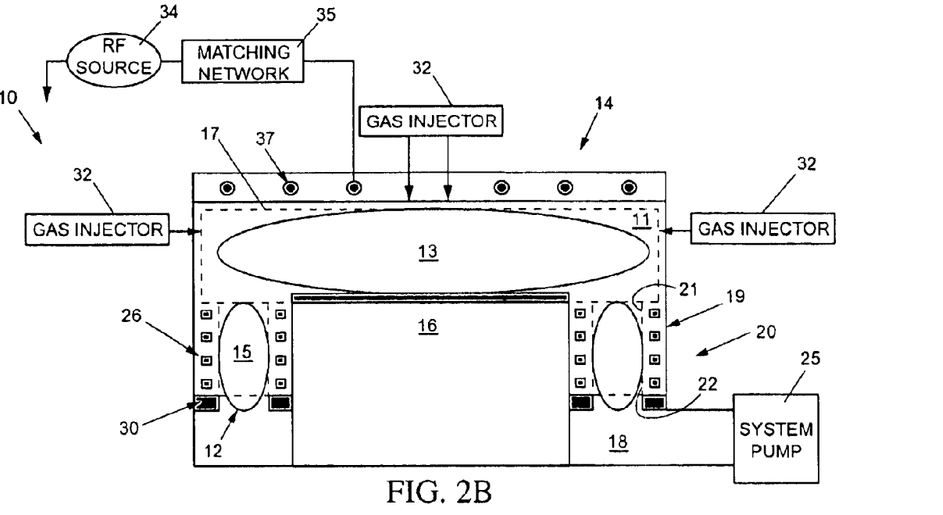
FIG. 2B is a schematic view showing another alternative plasma processing system and device embodying the principles of the present invention.
Figure 2C:
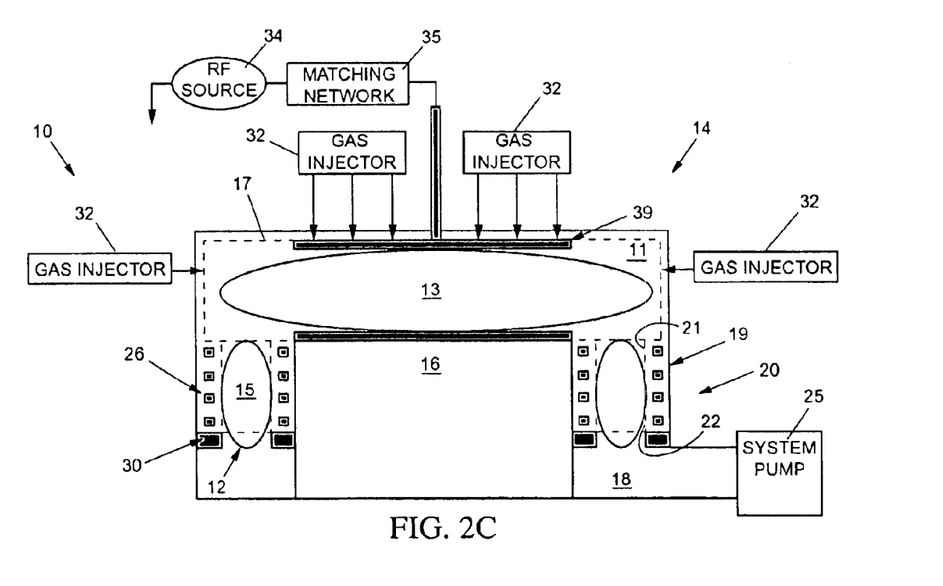
FIG. 2C is a schematic view showing yet another alternative plasma processing system and device embodying the principles of the present invention.

As shown in FIGS. 2A, 2B, and 2C, a variety of gas injectors 32 may be coupled to chamber 14, and various gas injecting operations may be used to introduce plasma processing gases 17 into the plasma processing region 11. The plasma processing gases, such as generation gas 17, are often introduced from gas injectors 32 located adjacent to or opposite from the substrate. For example, the gases may be injected through a gas inject plate opposite the substrate in an elecrostatically shielded radio frequency (ESRF) plasma source as shown in FIG. 2A, through a dielectric window opposite the substrate in a transformer coupled plasma (TCP) source as shown in FIG. 2B, or through an inject electrode opposite the substrate in a capacitively coupled plasma (CCP) source as shown in FIG. 2C. Other gas injector arrangements are known to those skilled in the art and may be employed in conjunction with the present invention.

A radio frequency (RF) source 34, which may be used in generating the process plasma 11, is coupled to the chamber 14 through connections made to an antenna coil (indicated at 37 in FIGS. 2A and 2B) or electrode (indicated at 39 in FIG. 2C). A matching network 35 may be coupled to the RF source 34 and the antenna coil 37 or electrode 39, as is generally known in the art. An arrangement of at least one RF source 34, at least one matching network 35, and at least one antenna coil 37 or electrode 39 acts as the plasma generator 33 shown in FIG. 1.

FIG. 2B shows the plasma in the plasma vacuum pump conduit 19 being generated by the antenna coil 37, which may be housed outside of the chamber 14 or the plasma vacuum pump conduit 19, similar to an inductively coupled HDP.

The chamber 14 is hermetically sealed and the plasma generation gases 17 are introduced into the chamber 14 by the gas injector 32. The effluent gases are removed through passages formed in the exterior of the chamber 14. The RF power supplied to the plasma can ignite a discharge with the plasma generation gas 17 introduced into the chamber 14, thus generating a plasma, such as plasmas 13, 15. For example, the RF source 34 may inductively couple an RF field from the antenna or RF coil 37 through the dielectric window or may capacitively couple an RF field from the electrode 39 in contact with the plasma generation gas 17.

The RF coil 37 may surround the vacuum chamber 14 to create a radio frequency electric field within the vacuum chamber 14 and thus, inductively produce the plasma processing region 11, which contains the process plasma 13 having a potential of 20 volts, for example, in the gas.

The plasma pump 20 includes the plasma vacuum pump conduit 19, which can be an annular closed-drift Hall-effect plasma pumping conduit, for example. The plasma vacuum pump conduit 19 has the inlet end 21 disposed adjacent the chamber 14 and the outlet end 22 disposed adjacent the chamber outlet region 18. The plasma vacuum pump conduit 19 defines the second region, or the plasma discharge region 12, in which plasma motion can be effected, for example, by cross-field transport.

As shown in FIGS. 1, 2A, 2B and 2C, at least one electrode 30 (the cathode electrode) is employed to provide improved pumping performance for a process plasma with low plasma density. An RF power amplifier with a coupling capacitor may be used to drive the electrode 30 to generate high density plasma (HDP) in the plasma vacuum pump conduit 19, independent from the process plasma 13. A negative DC voltage is self-generated on the electrode 30 to accelerate the ions and closed-drift electrons to the outlet end 22, except that the self-generated DC voltage will provide a much larger (~3×) electric field than the internal electric field sustained in the plasma. The plasma flow in the pumping duct is controlled by the RF power applied to the electrode 30, therefore, the pumping performance of the plasma vacuum pump conduit 19 can be controlled electrically, independently of the operation of the process plasma 13. Additional DC voltage may be optionally added to the ring electrode for plasma flow control if needed. Alternatively, the electrode may be grounded. Although a DC power supply may be used to provide the electrode 30 bias, the use of RF bias on the electrode 30 reduces possible sputtering of the electrode 30.

Figure 3:
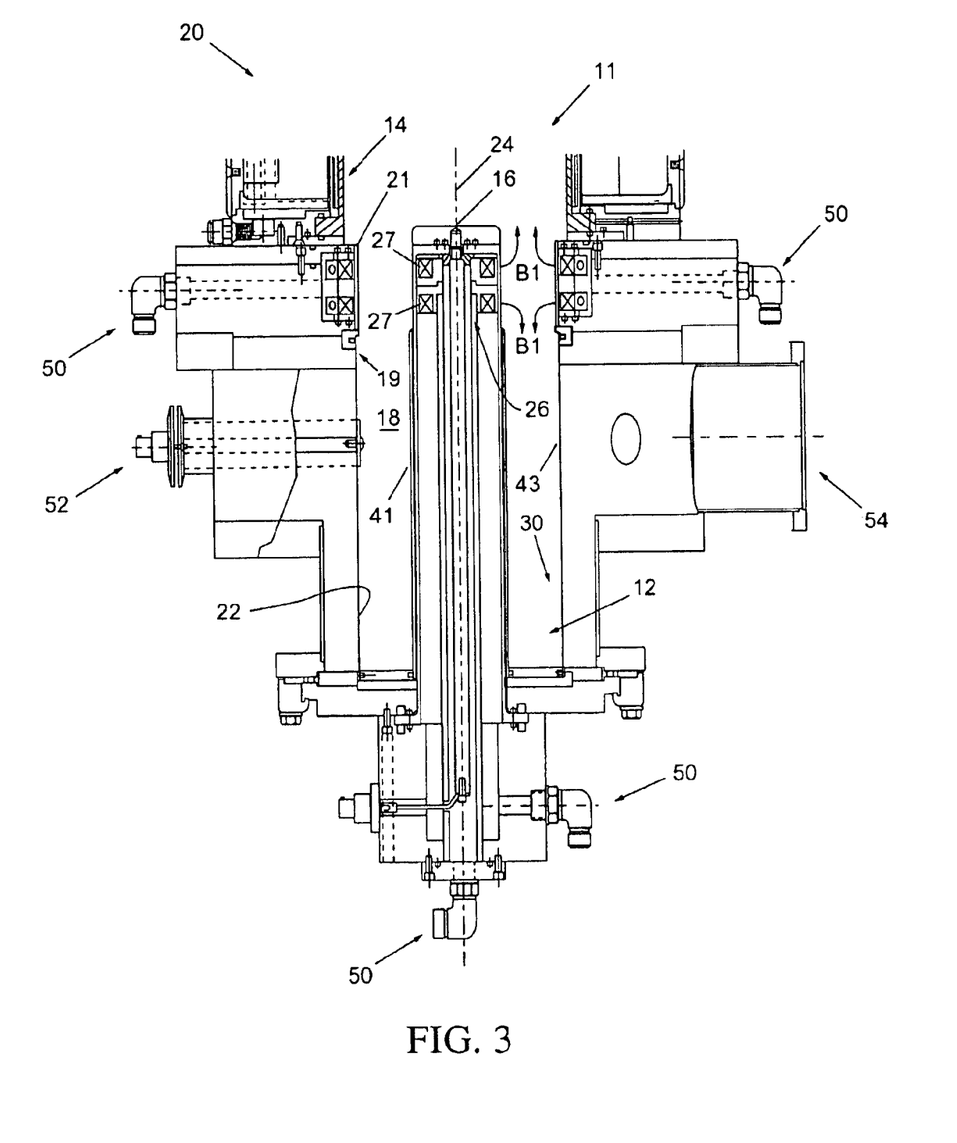
FIG. 3 is an illustrative diagram showing the plasma processing device of FIG. 1 having a magnet array configured to produce a ring cusp magnetic configuration.
Figure 5:
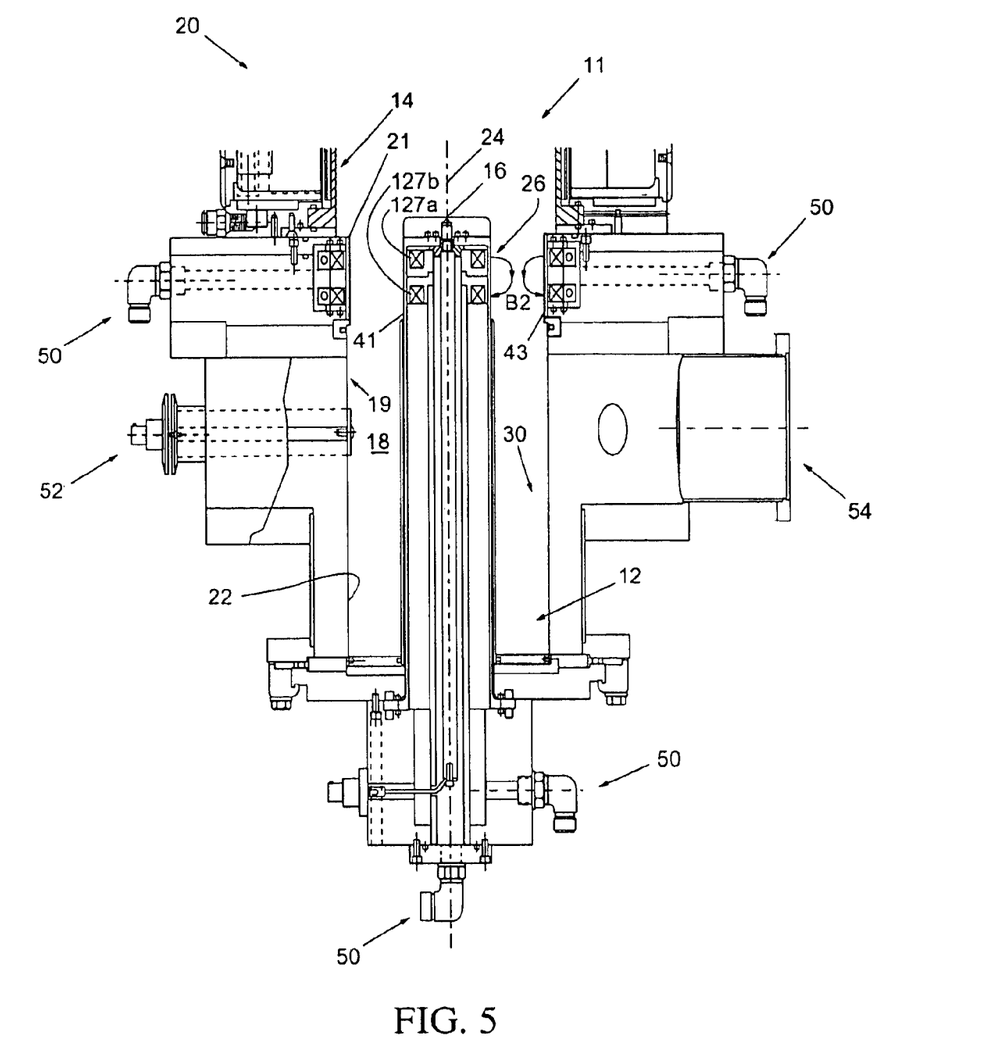
FIG. 5 is an illustrative diagram showing the plasma processing device of FIG. 1 having a magnet array configured to produce a mirror field magnetic configuration.

Alternatively, the cathode 30 may be, for example, a bird cage cathode as shown in FIGS. 3 and 5, located within the plasma vacuum pump conduit 19 further from an inlet end 21 than the magnet array 26. The cathode 30 may be biased by an adjustable power source (not shown), for example, to maintain an electric potential in the chamber outlet region 18, disposed proximate the outlet end 22 of the plasma vacuum pump conduit 19, substantially constant.

RF biasing of the chuck 16 is commonly employed in industrial process systems, which simplifies the application of RF power to the electrode 30. With RF bias capacitively coupled to the chuck 16, a self-generated DC voltage is developed on the chuck 16 in such a way to accelerate ions to the wafer. Using RF power at the same frequency and phase as the RF bias voltage on the chuck 16, the plasma 15 in a region near the outlet end 22 of the plasma vacuum pump conduit 19 will be biased negatively with respect to the process plasma potential.

FIG. 3 shows the chamber 14, the chuck 16, the conduit 19, the magnet array 26 and the cathode 30 in greater detail than in FIGS. 1, 2A, 2B and 2C. The chamber 14 can be formed from aluminum or another suitable material. Within the chamber 14, the chuck 16 is provided to hold the substrate to be processed by a plasma process. The chuck 16 may be used to hold a semiconductor wafer, integrated circuit, a sheet of a polymer material to be coated, a metal to be surface hardened by ion implantation, or some other semiconductor or non-semiconductor material to be etched or deposited, for example.

The chuck 16 is biased by an adjustable power supply (not shown) to a constant voltage, such as, for example, 0 volts, −10 volts or any voltage therebetween. Alternatively, the chuck electrode 16 may be RF biased to provide control of the ion energy delivered to the substrate surface as well as to serve as a bias electrode (with self DC-bias) for the plasma vacuum pump conduit 19. Chuck 16 may have additional features whose design is recognized by those of ordinary skill in the art including substrate lift pins (not shown) for substrate transfer to and from the chuck and an electrostatic clamp electrode (not shown) for securing the substrate to the chuck.

As shown in FIGS. 3 and 5, coolant may be supplied to the chuck 16 and the magnet array 26 through cooling supply passage 50 coupled to the chamber 14. Each cooling supply passage 50 may be coupled to a cooling supply source. For example, the cooling supply passages 50 could be individually connected to the cooling supply source. Alternatively, cooling supply passages 50 could be interconnected by a network of interconnecting passages that connect all cooling supply passages 50 in some pattern.

Various leads, for example, voltage probes or other sensors, may be coupled to the plasma processing system 10, as represented by lead 52 shown in FIGS. 3 and 5.

The plasma vacuum pump conduit 19 may be best understood from FIGS. 3 and 5, which show the plasma vacuum pump conduit 19 having a longitudinal axis 24 that extends between the inlet and outlet ends 21, 22 and inner and outer peripheries or conduit walls 41, 43 of the plasma vacuum pump conduit 19.

The conduit 19 has a generally cylindrical shape to provide peripheries or walls, including inner and outer conduit walls 41, 43, for example, made from a metal oxide such as alumina or silica (quartz) or another insulator or dielectric material. The inner and outer conduit walls 41, 43 are constructed from a non-conducting dielectric material and are provided along the inner periphery 41 of the plasma vacuum pump conduit 19 extending parallel to the longitudinally extending axis 24, such that an electric field can be developed along the axis 24 of the plasma vacuum pump conduit 19.

The plasma vacuum pump conduit 19 may have a toroidal configuration that extends circumferentially around the axis 24 and also extends in a longitudinal direction from the inlet end 21 to the outlet end 22 thereof.

The plasma pump conduit 19 is provided at the annular passage to enable high speed pumping in the process region 11 to improve overall process performance of the plasma processing system 10. The plasma pump conduit 19 can be used with any of the examples of plasma generating systems shown in FIGS. 1, 2A, 2B and 2C or with other, non-illustrated plasma generators. A system pump 25 (FIGS. 1, 2A, 2B and 2C) can be coupled to the outlet end 22 of the plasma vacuum pump conduit 19 to help remove pumping plasma 15 from the plasma vacuum pump conduit 19.

As shown in FIG. 3, the magnet array 26, which may include magnet rings 27, is arranged to provide a ring cusp magnetic configuration. Alternatively, the magnet array 26 can include upper and lower magnet rings 127a, 127b to provide a mirror field magnetic configuration, as shown in FIG. 5. In both magnetic configurations, the magnet array 26 is arrayed about the periphery of the plasma vacuum pump conduit 19 proximate the inlet end 21, to provide a magnetic field having field lines which extend generally transverse to the longitudinal axis 24 of the plasma vacuum pump conduit 19.

As best seen in FIGS. 3 and 5, the cathode 30 has a toroidal configuration and is located in close proximity to the outlet end 22 of the conduit. The cathode 30 is biasable to an electric potential different from an electric potential present in the plasma vacuum pump conduit 19 proximate the inlet end 21 using the adjustable RF or DC power supply (not shown). For example, the cathode 30 may be biased to an electric potential lower than the electric potential present in the plasma vacuum pump conduit 19 proximate the inlet end 21 so as to pump positive particles. Alternatively, the cathode 30 may be biased to an electric potential higher than the electric potential in the plasma vacuum pump conduit 19 proximate the inlet end 21 so as to pump negative particles.

The cathode 30 may be biased to create a continuously varying potential through the magnetic field region or may be biased to produce a constant voltage in the plasma vacuum pump conduit 19 near the outlet end thereof. For example, the cathode 30 may be biased to −50 volts. Alternatively, the cathode 30 could be RF biased to achieve a DC self-bias potential greater than or less than the bias imposed by chuck electrode 16.

Different powers may be supplied to the chuck 16 and the cathode 30 to produce differing biases on each by adjustable RF or DC power supplies (not shown). For example, the chuck 16 is biased to a higher voltage than the cathode 30 such that the chuck 16 acts as an anode with respect to the cathode 30 and a potential is produced between the chuck 16 and the cathode 30. When RF bias is employed, the electrode bias RF voltage can be kept in phase with the chuck bias voltage, such that the electrode 30 voltage is always more negative than the voltage on the chuck.

Electric field E is formed in a direction perpendicular to a magnetic field B1, B2 formed by the magnet array 26. The electric field E is used to accelerate ions out of the plasma processing region 11 in the longitudinal direction along the axis 24. The electrons tend to drift in the direction of E×B and the ions, which are generally heavier than the electrons, tend to follow the electric field E. To provide space-charge neutralization for the ions, the electrons that carry the current are accelerated collectively by the J×B Lorentz force in the direction of the ions.

FIGS. 3 and 5 show the magnet array 26 disposed around the inner periphery of the plasma vacuum pump conduit 19 and positioned below the chuck 16 and the inlet end 21 thereof. The magnet array 26 has a toroidal configuration and can include identical upper and lower magnet rings 27, vertically spaced from one another to form a ring cusp magnetic configuration, as described above and shown in FIGS. 3 and 4, or can include vertically spaced upper and lower magnet arrays 127a, 127b to form a mirror field magnetic configuration, as also described above and shown in FIGS. 5–7. Each of the magnet rings 27, 127a and 127b include an inner (or first) sub-array 40, 140a, 140b and an outer (or second) sub-array 42, 142a, 142b, respectively. The inner sub-arrays 40, 140a, 140b are housed in the dielectric inner conduit wall 41 of the plasma vacuum pump conduit 19 while the outer sub-arrays 42, 142a, 142b are housed in the outer conduit wall 43 of the plasma vacuum pump conduit 19.

The inner and outer sub-arrays 40, 42 each include magnets 44 arrayed to produce magnetic field B1, as shown in FIG. 3, which is configured to guide the plasma from the surrounding processing region 11 to the inlet end 21 of the plasma vacuum pump conduit 19. By having the magnetization direction of the inner magnet sub-array 40 in the opposite direction of that of the outer sub-array 42 (FIG. 4), the plasma is allowed to flow into the plasma vacuum pump conduit 19 naturally, i.e., by the free expansion of plasma, while less insulation is provided from back-flowing electrons in the plasma downstream.

The inner and outer sub-arrays 140a, 140b, 142a, 142b each include magnets 44 arrayed to produce magnetic field B2, as shown in FIG. 5. The mirror field magnetic configuration is configured to provide better insulation, i.e., electron backflow in the plasma downstream, but can restrict plasma flow at the inlet end 21 of the plasma vacuum pump conduit 19.

The magnetic field, either B1 or B2, in the plasma vacuum pump conduit 19 mechanistically provides several functions according to the principles of the present invention, namely: (1) it serves to guide the plasma from the plasma processing region 11 into the inlet end 21 of the plasma vacuum pump conduit 19, (2) it confines the plasma against losses to the conduit wall surfaces, and, (3) it insulates the plasma electrons from back-streaming to the process plasma region 11. Depending on the condition of the process plasma 11, either the ring-cusp magnetic configuration or the mirror field magnetic configuration can be selected.

Figure 4:
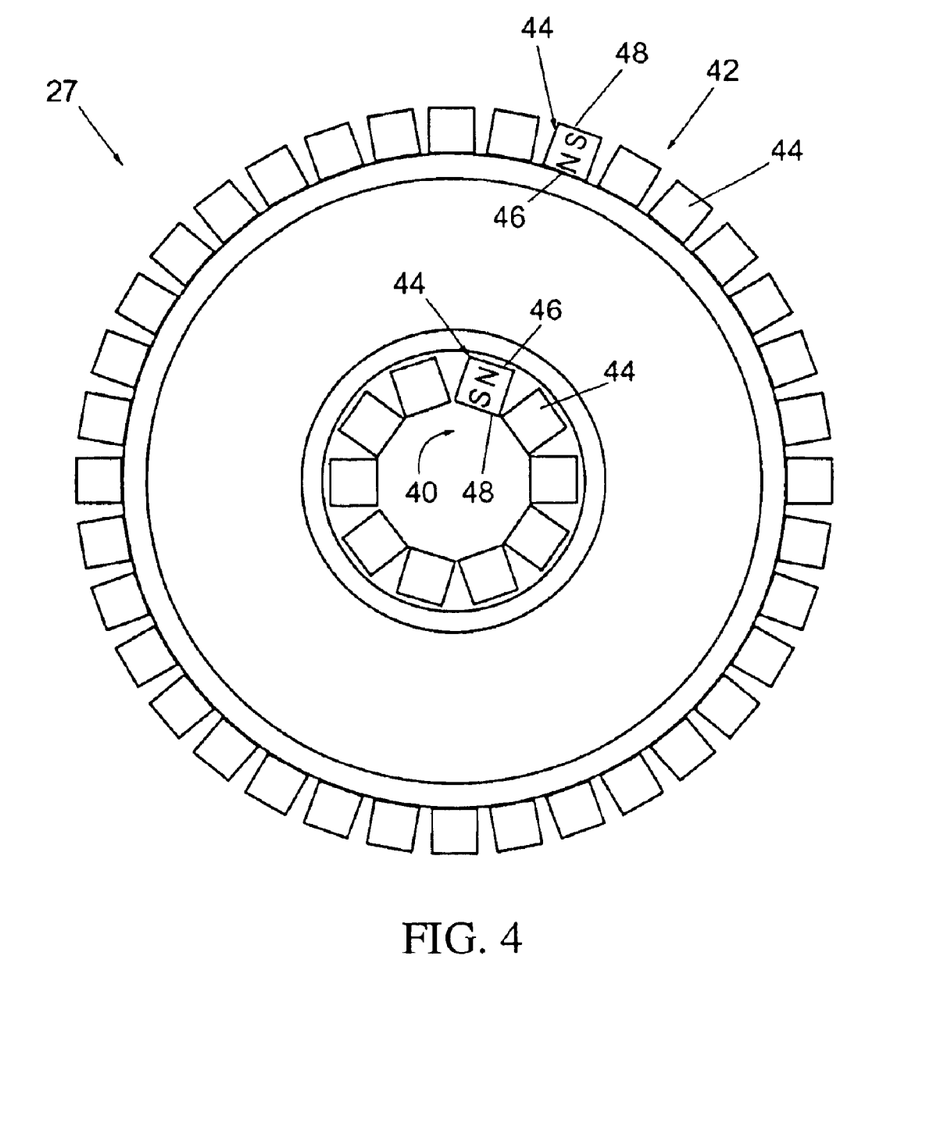
FIG. 4 is an illustrative diagram showing a magnet ring of the magnet array shown in FIG. 3.

FIG. 4 shows the magnet rings 27 in greater detail. Each magnet 44 in the inner and outer sub-arrays 40, 42 has a first magnetic pole 46 and a second magnetic pole 48. In FIG. 4, the inner and outer sub-arrays 40, 42 of magnet ring 27 are positioned to be opposite in polarity to the each other (i.e., the first magnetic pole 46 of the inner sub-array 40 is positioned in adjacent, spaced relation to the first magnetic pole 46 of the outer sub-array 42). In the magnet rings 27, the magnets 44 employed in the inner sub-array 40 have a polarization direction directed radially outwards, while magnets 44 in the outer sub-array 42 have a polarization direction directed radially inwards, opposite to the polarization direction of the inner sub-array 40, which produces the ring cusp magnetic configuration, represented in FIG. 3 by the magnetic field B1.

In the ring cusp configuration, an even number of magnet rings 27 are used on the inner and outer conduit walls 41, 43. The magnetization directions of any two adjacent magnet rings 27 are pointed in opposite directions, such that there is an axial field near the surface of the inner conduit wall 41. This arrangement also avoids magnetic field generation in regions far away from the plasma vacuum pump conduit 19, such as in the process plasma region 11.

With respect to FIGS. 3 and 4, the process plasma 13 is pumped through the annular plasma vacuum pump conduit 19 by the natural expansion of the plasma. The expansion of the plasma internally generates an axial electric field pointing from the inlet end 21 to the outlet end 22 of the plasma vacuum pump conduit 19, which accelerates the ions. The electric field is described by $E = -d\phi/dz$ and $\phi = \kappa T/e \ln[n(z)/n_0]$, where $\phi(z)$ is the plasma potential, $n(z)$ is the ion density, $T$ is the electron temperature, $n_0$ is the electron density at the entrance $z=0$, $z$ is the spatial coordinate along the length of the conduit and $\kappa$ is Boltzmann's constant ($\kappa = 1.38 \times 10^{-23}$ J/K). The electric field E is oriented from the high-density end to the low-density end of the plasma vacuum pump conduit 19, accelerating the plasma ions to flow from the inlet end 21 to the outlet end 22 of the plasma vacuum pump conduit 19. Under the influence of the electric field E and the radial component of the electric field, the electrons are drifting in a closed loop in the annular direction and form closed drift electron current J. The electron flow associated with the closed drift current J are axially accelerated by the J×B Lorentz force to move with the ions. Ring cusp magnet arrays, such as magnet array 26 including upper and lower magnet rings 27, are more efficient for processing systems with high density plasma (HDP).

Two annular magnet sub-arrays 40, 42 are arranged on the outer and inner and outer conduit walls 41, 43 of the plasma vacuum pump conduit 19 (FIG. 3) to provide an axial magnetic field component near the surface of the conduit walls 41, 43. The surface field is used to prevent electron loss to the inner conduit walls 41, 43. To provide this surface field, the magnetization direction of the magnets 44 in the upper magnet ring 27 are positioned to have a magnetization direction opposite to those magnets 44 of the lower magnet ring 27. The distance between the adjacent magnet rings 27 is kept about the same distance between the inner and the outer walls, e.g. the width of the annular plasma vacuum pump conduit 19. For example, for a plasma vacuum pump conduit with an axial length greater than the width, a magnet array 26 including more than two magnet rings 27 may be needed.

Figure 6:
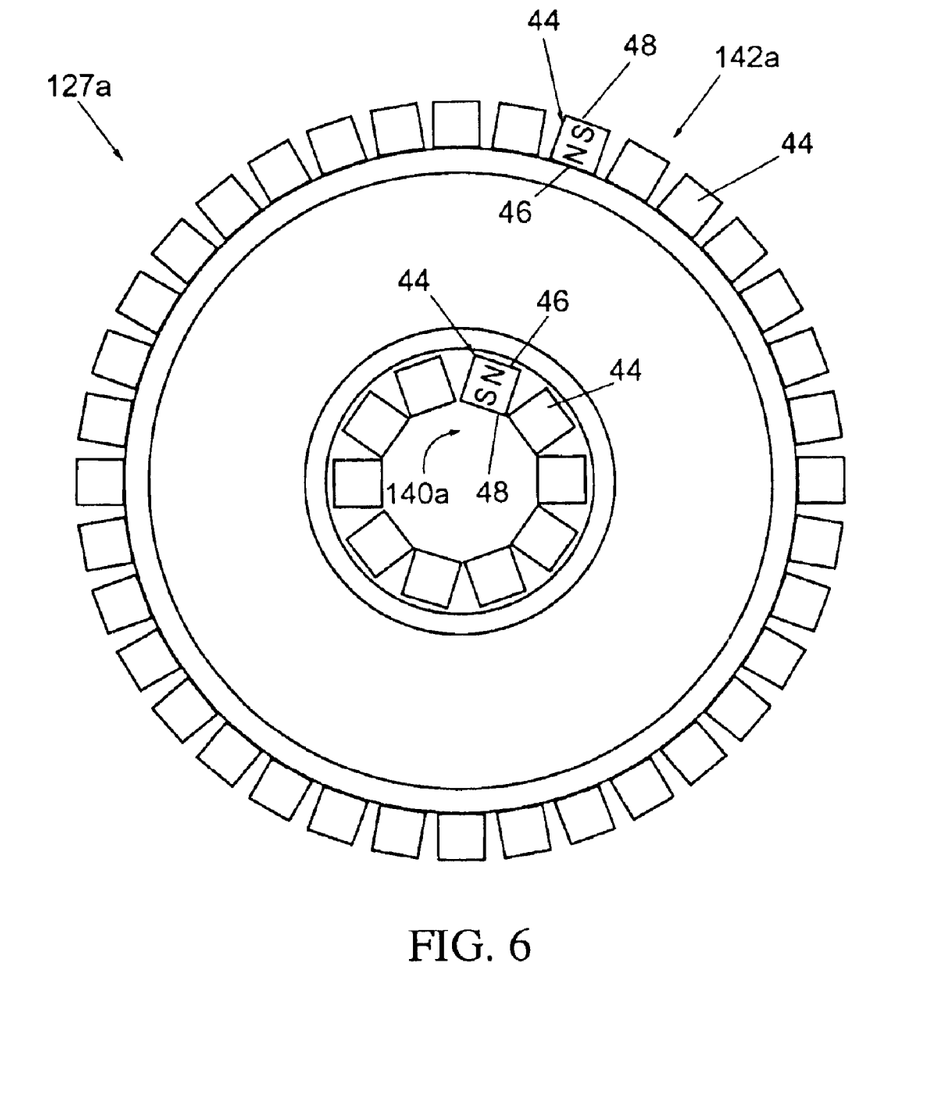
FIG. 6 is an illustrative diagram showing an upper magnet ring of the magnet array shown in FIG. 5.
Figure 7:
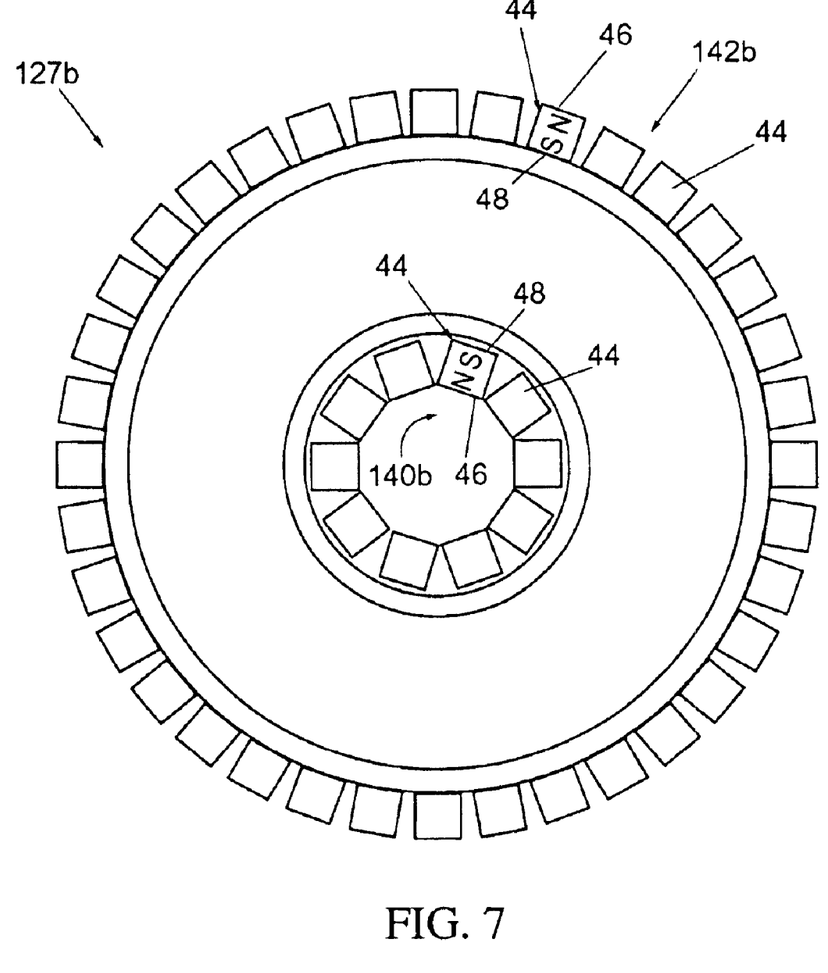
FIG. 7 is an illustrative diagram showing a lower magnet ring of the magnet array shown in FIG. 5.

FIGS. 6 and 7 show the magnet rings 127a, 127b in greater detail. The magnet rings 127a (FIG. 6) are substantially identical to the magnet rings 27. Each magnet 44 in the inner and outer sub-arrays 140a, 140b, 142a and 142b has a first magnetic pole 46 and a second magnetic pole 48. FIG. 6 shows the inner and outer sub-arrays 140a, 142a of magnet ring 127a positioned to be opposite in polarity to the each other (i.e., the first magnetic pole 46 of the inner sub-array 140a is positioned in adjacent, spaced relation to the first magnetic pole 46 of the outer sub-array 42). In the magnet rings 27, the magnets 44 employed in the inner sub-array 140a have a polarization direction directed radially outwards, while magnets 44 in the outer sub-array 142a have a polarization direction directed radially inwards, opposite to the polarization direction of the inner sub-array 140a.

In FIG. 7, the inner and outer sub-arrays 140b, 142b of magnet ring 127b are positioned to be opposite in polarity to the each other (i.e., the second magnetic pole 48 of the inner sub-array 140b is positioned in adjacent, spaced relation to the second magnetic pole 48 of the outer sub-array 142b). In the magnet rings 127b, the magnets 44 employed in the inner sub-array 140b have a polarization direction directed radially inwards, while magnets 44 in the outer sub-array 142b have a polarization direction directed radially outwards. The polarization directions of the magnets 44 in the vertically spaced magnetic rings 127a and 127b cooperate to produce the mirror field magnetic configuration, as represented in FIG. 5 by the field lines B2

Each magnet 44 in the magnetic rings 27, 127a and 127b can be a permanent magnet with magnetic poles 46, 48 designed and positioned to provide an appropriate field, such as the magnetic fields B1, B2. For example, in FIGS. 4, 6 and 7, the magnets 44 are oriented in the same direction. Alternatively, an electromagnet could be properly shaped, placed and wound to produce equivalent fields.

As noted above, the magnets 44 in the inner and outer sub-arrays 40, 140a, 142a, 42, 142a and 142b are arrayed in an annular configuration or toroidal configuration, which allows the inner and outer sub-arrays 40, 42 and 140a, 142a, 140b, 140b to apply the respective magnetic field B1, B2 in the radial direction across the plasma vacuum pump conduit 19. Though the magnet sub-arrays 40, 42 and 140a, 142a, 140b, 142b are shown inside the vacuum chamber 14, the magnet sub-arrays 40, 42 and 140a, 142a, 140b, 142b may be positioned either inside or outside of the chamber 14 in principle.

The magnetic fields B1, B2 are each generated perpendicular to the electric field E formed in the direction of the longitudinal axis 24. The strength of the magnetic field may be diminished toward the cathode 30 and the field strength of the magnetic field in the plasma processing region 11 might be on the order of several hundred Gauss, for example, 200 Gauss.

Depending on the magnitude of the magnetic field and the size of the chamber 14, a portion of the ions hit the conduit walls 41, 43 while most of the electrons are contained in a helical orbit about the longitudinal axis 24 in the magnetic region formed by the magnetic array 26 due to the Hall Effect. The Hall Effect is exhibited when one of the magnetic fields B1, B2 exerts a transverse force on the moving charge carriers, e.g., the electrons, where the transverse force tends to push the electrons to one side of the plasma vacuum pump conduit 19. The resulting current, interacting with the magnetic field, leads to a J×B Lorentz Force, which causes plasma flow from the processing region 11 to the discharge region 12, through the radially extending magnetic field B1 or B2.

The magnetic fields B1 and B2 are described herein as extending transversely to the longitudinal axis 24, but as shown in FIGS. 3 and 5, each of the magnetic fields B1 and B2 include a radial component as well as an axial component to form a minimum B cusp field.

Multiple layers of permanent magnets having alternating magnetization can be provided, with a minimum B cusp field between every two magnet layers. These configurations allow the formation of a high-density local plasma or an "inter-stage plasma", for example, by using capacitive or inductive coupling of RF power. These "inter-stage plasmas" can contribute to enhanced pumping speed and pump compression ratio.

In addition to a component of the electric field E being generated by the cathode 30, a component of the electric field E is self-generated in the magnetized region between the plasma processing region 11 and the plasma discharge region 12. The component of the electric field is self-generated due to the space potential of the process plasma 13 and the exit plasma 15 being independently controlled, for example, by separate power sources (not shown). The electric field E can be a steady state, self-consistent electric field which is configured to accelerate ions. Electron back flow (flow from the plasma discharge region 12 to the plasma processing region 11) is minimized due to the Hall Effect in combination with the magnetic field, represented by field lines B1, B2 in FIGS. 3 and 5.

In the embodiments shown in FIGS. 3 and 5, a J×B Lorentz force moves a closed-loop electron current, which in the illustrated embodiment, can be expressed by the formula:

$$J = -ne(E \times B)/B^2 \qquad (1)$$

where n is the number of electrons, e is the charge of the electrons, E×B/B$^2$ is the velocity of the electrons which drift with a spiral motion in the direction defined by the vector E×B (perpendicular to the electric field (E)).

The electric field E accelerates ions in the chamber 14 while ion-neutral charge exchange collisions rapidly transfer the ion momentum to the neutral particles in the process plasma 13. The radial magnetic field B1 or B2, extending generally transverse to the longitudinal axis 24 of the plasma vacuum pump conduit 19, deflects the electrons in a circumferential direction so that the electrons move in a spiral trajectory. The electrons accumulate energy as they gradually drift in the direction defined by the vector E×B (perpendicular to the electric field E).

In the discharge region 12, which is proximate to the cathode 30, some of the electrons ejected from the cathode 30 can collide with particles of the plasma generating gas, causing ionization. With respect to FIGS. 3 and 5, the resulting positively charged ions are accelerated by the electric field E towards the outlet end 22 of the plasma vacuum pump conduit 19, from which they are expelled, for example, through an outlet 54. Other electrons may neutralize some ions when the ions pass the cathode 30. Therefore, the plasma pump 10 produces ion and fast neutral particles that can improve the total throughput of the plasma pump 10.

Since ions have a much greater mass than the electrons, the ions are not substantially influenced by the magnetic fields B1, B2 and the ions accelerate in an axial direction, rather than circumferential with respect to the conduit. The ions tend to remain in the discharge region 12 of the plasma vacuum pump conduit 19, where the ions can be expelled through the outlet 54.

The pumping action is generated by the electric field E, which is created by means of controlling the electric potential of the cathode 30 and the electric potential present in the plasma vacuum pump conduit 19 proximate the inlet end 21. Also, the space potential between the two plasmas 13, 15 may be controlled, which may help create the electric field E. At a certain operating pressure range, for example, 0.01 to 1 Torr, the ions transfer energy to the neutral particles and regain energy from the electric field E to provide a large pumping throughput in the plasma vacuum pump conduit 19.

Alternate configurations of the plasma processing system 10 and the plasma pump system 20 are possible. For example, though the plasma vacuum pump conduit 19 is described above as being cylindrical, but other shapes can be used. Additional pumping capacity may be obtained in the plasma pump 20 by enlarging the pumping system or by providing an array of pumps.

Figure 8:
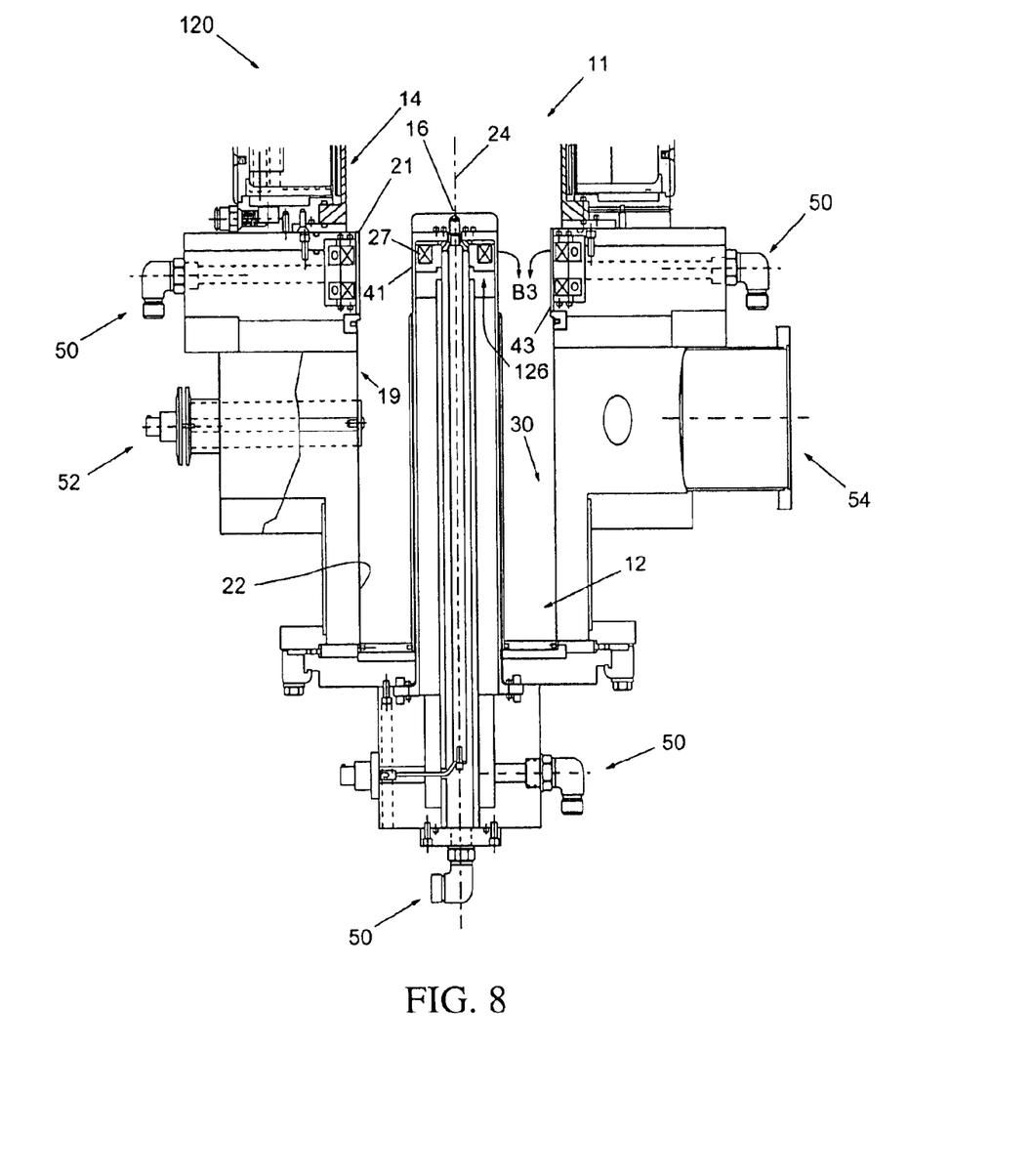
FIG. 8 is an illustrative diagram showing a further alternative embodiment of the plasma processing device embodying the principles of the present invention.

FIG. 8 shows a plasma pump 120, which is one alternative configuration to the plasma pump 20. The plasma pump 120 includes magnet array 126, which is formed by either one magnet ring 27 (FIGS. 3 and 4) or one of the magnet rings 127a, 127b (FIGS. 5 and 6, 7). The magnet array 126 in the plasma pump 120 can be configured to provide a magnetic field that is similar in strength to the magnetic array 26 and which extends generally transverse to the longitudinal axis 24 of the plasma vacuum pump conduit 19. The magnetic field B3 provided by the magnet array 126 is substantially identical in construction and operation to the magnetic field B1 provided by the magnet array 26, including magnet rings 27, disposed in the plasma processing system 10. The plasma pump 120 operates substantially identical to the plasma pump 20 while using only a single inner sub-array, thus simplifying its construction.

Figure 9:
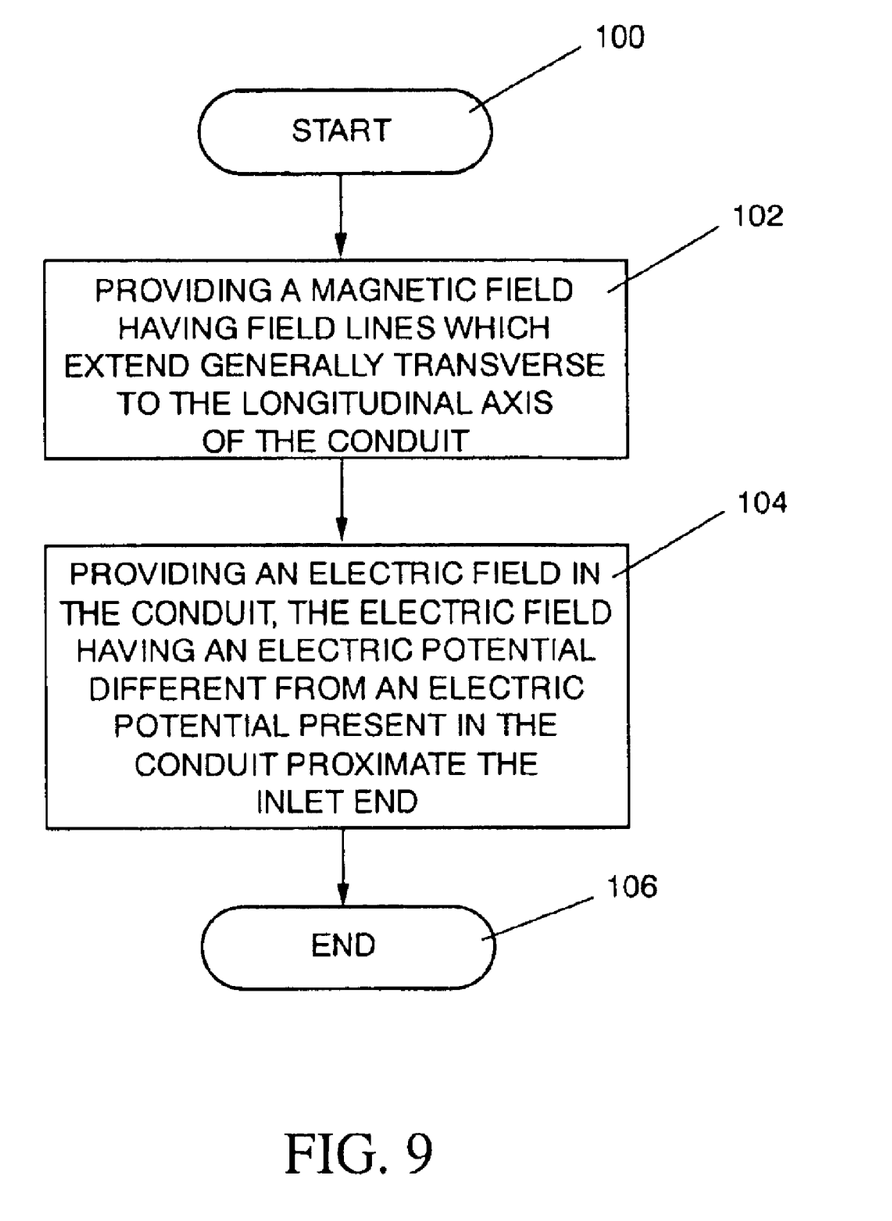
FIG. 9 is a flow chart showing a method of pumping particles from a first region containing a plasma to a second region containing a plasma at a higher pressure through a toroidal conduit embodying the principles of the principles of the present invention.

FIG. 9 shows a method of pumping particles from the first region 11 containing the process plasma 13 to the second region 12 through the plasma vacuum pump conduit 19. The method begins at 100. At 102, a magnetic field is provided. The magnetic field has field lines which extend generally transverse to the longitudinal axis 24 of the plasma vacuum pump conduit 19. At 104, an electric field is provided in the plasma vacuum pump conduit 19. The electric field has an electric potential different from an electric potential present in the plasma vacuum pump conduit 19 proximate the inlet end 21. During operation, the ions from the first region 11 travel past the magnetic field B1 or B2 (depending on the desired magnetic configuration), through the plasma vacuum pump conduit 19 and a portion of electrons attracted to the first region 11 are blocked, by the magnetic field B1, B2, from traveling from the discharge region 12 to the plasma processing region 11. Hence, the plasma pump 20 reduces the pressure in the chamber 14 relative to the plasma vacuum pump conduit 19. At 106, the method ends.

While the invention has been described with reference to certain illustrated embodiments, including particular structures, acts and materials, the invention is not to be limited to the particulars disclosed, but rather extends to all equivalent structures, acts, and materials, such are within the scope of the appended claims.

Since numerous modifications and changes to the embodiments described above will readily occur to those of ordinary skill in the art, it is not desired to limit the invention to the exact construction and operation illustrated and described. Accordingly, all suitable modifications and equivalents should be considered as falling within the spirit and scope of the invention.

What is claimed is:

1. A plasma pump to pump particles from a first region containing a plasma to a second region containing a plasma at a higher pressure, comprising:
   a toroidal conduit having an inlet end and an outlet end, a longitudinal axis extending between the inlet end and the outlet end and inner and outer peripheries extending between the inlet end and the outlet end;
   an inner array of magnets, arrayed about the inner periphery of the conduit proximate the inlet end;
   an outer array of magnets, arrayed about the outer periphery of the conduit proximate the inlet end, the inner and outer arrays cooperating to provide a magnetic field having field lines which extend generally transverse to the longitudinal axis of the conduit;
   a cathode, located within the conduit, further from the inlet end than the arrays of magnets and biasable to an electric potential different from an electric potential present in the conduit proximate the inlet end.

2. The plasma pump of claim 1, wherein the arrays of magnets further each comprise a first sub-array and a second sub-array, disposed such that each sub-array is opposite in polarity to the other.

3. The plasma pump of claim 1, wherein the cathode extends along the conduit from a region proximate the magnets.

4. The plasma pump of claim 1, wherein the cathode is biasable to an electric potential lower than the electric potential present in the conduit proximate the inlet end so as to pump positive particles.

5. The plasma pump of claim 1, wherein the cathode is biasable to an electric potential higher than the electric potential in the conduit proximate the inlet end so as to pump negative particles.

6. The plasma pump of claim 1, wherein the cathode is biasable to an electric potential capable of maintaining a substantially constant electric potential in a portion of the conduit extending from a location proximate the outlet end thereof toward the arrays of magnets.

7. A plasma processing system comprising:
   a chamber containing a plasma processing region;
   a chuck, constructed and arranged to support a substrate within the chamber in the processing region;
   a chamber outlet, to enable particles within the plasma processing region to exit the chamber;
   a toroidal conduit having an inlet end and an outlet end, the inlet end disposed adjacent the chamber outlet, a longitudinal axis extending between the inlet end and the outlet end and inner and outer peripheries extending between the inlet end and the outlet end;
   an inner array of magnets, arrayed about the inner periphery of the conduit proximate the inlet end,
   an outer array of magnets, arrayed about the outer periphery of the conduit proximate the inlet end, the inner and outer arrays cooperating to provide a magnetic field having field lines which extend generally transverse to the longitudinal axis of the conduit;
   a cathode, located within the conduit, further from the inlet end than the array of magnets and biasable to an electric potential different from an electric potential present in the conduit proximate the inlet end.

8. The plasma processing system of claim 7, wherein the array of magnets further comprises a first sub-array and a second sub-array, disposed such that each sub-array is opposite in polarity to the other.

9. The plasma processing system of claim 7, wherein the cathode extends along the conduit from a region proximate the magnets.

10. The plasma processing system of claim 7, wherein the cathode is biasable to an electric potential lower than the electric potential present in the conduit proximate the inlet end so as to pump positive particles.

11. The plasma processing system of claim 7, wherein the cathode is biasable to an electric potential higher than the electric potential in the conduit proximate the inlet end so as to pump negative particles.

12. The plasma processing system of claim 7, wherein the cathode is biasable to an electric potential capable of maintaining a substantially constant electric potential in a portion of the conduit extending from a location proximate the outlet end thereof toward the array of magnets.

13. In a plasma pump configured to pump particles from a first region containing a plasma to a second region containing a plasma at a higher pressure, the plasma pump comprising a toroidal conduit having an inlet end and an outlet end, a longitudinal axis extending between the inlet end and the outlet end and inner and outer peripheries extending between the inlet end and the outlet end, an inner array of magnets, arrayed about the inner periphery of the conduit proximate the inlet end, an outer array of magnets, arrayed about the outer periphery of the conduit proximate the inlet end, the inner and outer arrays cooperating to provide a magnetic field having field lines which extend generally transverse to the longitudinal axis of the conduit, and a cathode, located within the conduit, further from the inlet end than the arrays of magnets and biasable to an electric potential different from an electric potential present in the conduit proximate the inlet end, a method of pumping particles from the first region to the second region, comprising:

providing a magnetic field having field lines which extend generally transverse to the longitudinal axis of the conduit; and providing an electric field in the conduit, having an electric potential different from an electric potential present in the conduit proximate the inlet end.

14. The method of claim 13, wherein ions from the first region travel past the magnetic field through the conduit and a portion of electrons attracted to the first region are blocked by the magnetic field.

15. The method of claim 13, wherein the electric field is biasable to an electric potential capable of maintaining a substantially constant electric potential in a portion of the conduit extending from a location proximate the outlet end thereof toward the array of magnets.

* * * * *